(12) United States Patent
Krueger et al.

(10) Patent No.: US 9,165,905 B2
(45) Date of Patent: Oct. 20, 2015

(54) METHOD FOR CONNECTING A PLURALITY OF UNPACKAGED SUBSTRATES

(75) Inventors: Hans Krueger, Munich (DE); Alexander Schmajew, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 974 days.

(21) Appl. No.: 13/330,422

(22) Filed: Dec. 19, 2011

(65) Prior Publication Data

US 2012/0159778 A1 Jun. 28, 2012

(30) Foreign Application Priority Data

Dec. 23, 2010 (DE) .......................... 10 2010 055 935

(51) Int. Cl.
*H05K 3/02* (2006.01)
*H05K 3/10* (2006.01)
(Continued)

(52) U.S. Cl.
CPC ................ *H01L 24/94* (2013.01); *B81B 7/007* (2013.01); *H01L 24/24* (2013.01); *H01L 24/82* (2013.01); *H01L 24/97* (2013.01); *H01L 25/0657* (2013.01); *H01L 25/50* (2013.01); *B81B 2207/098* (2013.01); *H01L 2224/24011* (2013.01); *H01L 2224/24051* (2013.01); *H01L 2224/24147* (2013.01); *H01L 2224/24991* (2013.01); *H01L 2224/94* (2013.01);
(Continued)

(58) Field of Classification Search
CPC ......... H01L 24/24; H01L 24/82; H01L 24/94; H01L 24/97; H01L 25/50; H01L 25/0657; H01L 2225/06551; H01L 2224/24147; H01L 2924/01047; H01L 2924/014; H01L 2224/24991; H01L 2224/24011; H01L 2924/01006; H01L 2924/14; H01L 2924/01068; H01L 2224/94; H01L 2225/06513; H01L 2924/1068; H01L 2924/01033; H01L 2224/81; H01L 2224/82; B81B 7/007; B81B 2207/098; Y10T 29/4912; Y10T 29/49128; Y10T 29/49165; Y10T 29/49789
USPC ............ 29/830, 831, 846, 852, 412; 438/406, 438/459, 624, 928
See application file for complete search history.

(56) References Cited

U.S. PATENT DOCUMENTS 5,268,326 A * 12/1993 Lesk et al. ................... 438/406
5,910,687 A   6/1999 Chen et al.
(Continued)

FOREIGN PATENT DOCUMENTS

DE       101 41 710 A1    3/2003
WO       WO 95/34083 A1   12/1995

*Primary Examiner* — Donghai D Nguyen
(74) *Attorney, Agent, or Firm* — Slater & Matsil, L.L.P.

(57) ABSTRACT

A plurality of unpackaged substrates connected to one another is disclosed. The stepped structures on and/or in a first main area of a first substrate include a plurality of integrated circuits. The stepped structures run between the integrated circuits. The first conductor tracks extend from at least some contact connections of the respective integrated circuits as far as the stepped structures. The first substrate is connected on the side of the first main area to a further substrate. The first substrate is severed from a second main area opposite to the first main area such that the first substrate is divided into a plurality of substrate pieces. Each substrate piece has one of the integrated circuits. The first conductor tracks are accessible in interspaces between the substrate pieces. The second conductor tracks are formed from the second main area. At least some of the second conductor tracks lead from the second main area over side walls of the substrate pieces as far as the first conductor tracks.

20 Claims, 7 Drawing Sheets

(51) Int. Cl.
*H01L 23/00* (2006.01)
*H01L 25/065* (2006.01)
*H01L 25/00* (2006.01)
*B81B 7/00* (2006.01)

(52) U.S. Cl.
CPC ............... *H01L2225/06513* (2013.01); *H01L 2225/06551* (2013.01); *H01L 2924/014* (2013.01); *H01L 2924/01005* (2013.01); *H01L 2924/01006* (2013.01); *H01L 2924/01033* (2013.01); *H01L 2924/01047* (2013.01); *H01L 2924/01068* (2013.01); *H01L 2924/01082* (2013.01); *H01L 2924/1068* (2013.01); *H01L 2924/14* (2013.01); *H01L 2924/1461* (2013.01); *Y10T 29/49126* (2015.01)

(56) References Cited

U.S. PATENT DOCUMENTS 6,121,119 A   9/2000  Richards et al.
7,488,680 B2 * 2/2009  Andry et al. ............... 438/624

* cited by examiner

METHOD FOR CONNECTING A PLURALITY OF UNPACKAGED SUBSTRATES

This application claims priority to German Patent Application 10 2010 055 935.0, which was filed Dec. 23, 2010 and is incorporated herein by reference.

TECHNICAL FIELD

Embodiments of the invention relate to a method for connection a plurality of unpackaged substrates.

BACKGROUND

In order that substrates stacked one above another are interconnected with one another, contact connections of the wiring planes of the integrated circuits can be contact-connected by soldering or bonding. Such connections can be wire bonding connections, for example, but the latter are not very space-saving. In the case of substrates (in particular, wafers) composed of semiconductor material, via contacts can also be produced through the substrate. In the case of substrates composed of lithium tantalate ($LiTaO_3$), lithium niobate ($LiNbO_3$), or other non-etchable materials, however, via through-plating is very labor and cost intensive.

There is a need for a cost-effective and diverse method for interconnecting the contact connections of a plurality of substrates and chips that are to be stacked one above another in a space-saving manner. Such a method should as far as possible also enable the formation of cavity housings and be suitable for the production of microelectromechanical structures (MEMS) and also components in which surface acoustic waves (SAW) and bulk acoustic waves (BAW) can be formed.

SUMMARY OF THE INVENTION

The invention relates to a method for connecting a plurality of unpackaged substrates. In microelectronics and nanoelectronics, for instance for piezoelectric applications, it is necessary to connect two or more planar substrates to one another, that is to say to mechanically fix them to one another and also to electrically interconnect them with one another. In this case, for space reasons, in particular unpackaged substrates, i.e., substrates without a housing, are connected to form a "wafer level package" comprising a plurality of substrates stacked one above another. Particularly in the case of a "system-in-package" or other arrangements comprising substrates interconnected with one another in all three dimensions, multi-level component modules are realized.

The application proposes a method for connecting a plurality of unpackaged substrates to one another, wherein the method comprises forming stepped structures on and/or in a first main area of a first substrate having a plurality of integrated circuits. The stepped structures run between the integrated circuits. First conductor tracks are formed extending from at least some contact connections of the respective integrated circuits as far as the stepped structures. The first substrate is connected on the side of its first main area to a further substrate or to a stack of further substrates, preferably by substrate bonding. The first substrate is severed from a second main area opposite to the first main area in a manner such that the first substrate is divided into a plurality of substrate pieces, each having one of the integrated circuits. The first conductor tracks are accessible in interspaces between the substrate pieces. Second conductor tracks are formed from the second main area. At least some of the second conductor tracks lead from the second main area over side walls of the substrate pieces as far as the first conductor tracks.

In accordance with embodiments of this method, conductor tracks extending around the side walls of the respective chips or substrate pieces are produced which extend from the first main area as far as the second main area of the respective substrate piece and include first and second conductor tracks that were produced in different method steps. In this case, the contact-connection of the first conductor tracks by the second conductor tracks is made possible by the previous formation of stepped structures. Sections of the first conductor tracks on the side flanks of the stepped structures in each case become accessible after the substrate has been divided into the respective substrate pieces.

BRIEF DESCRIPTION OF THE DRAWINGS

Some exemplary embodiments will be described by way of example with reference to the figures, in which.

DETAILED DESCRIPTION OF ILLUSTRATIVE EMBODIMENTS

Figure 1A:
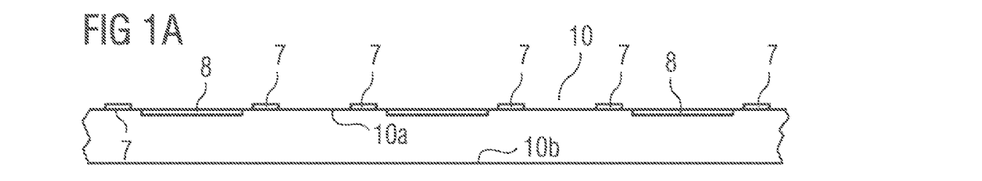
FIGS. 1A to 1H show a first type of embodiment of the method.

FIGS. 1A to 1H illustrate a first type of embodiment of the method presented here. The illustration shows in each case a partial cross-sectional view (initially of the first substrate 10), to be precise only schematically and, in order to enable better identification of the individual elements, in a manner not true to scale. FIG. 1A shows a partial excerpt from a first substrate 10, on which three integrated circuits 8, for instance semiconductor circuits, and also contact connections 7 arranged on both sides thereof can be discerned at the top side, i.e., the first main area 10a, in the cross-sectional view. The substrate contains a multiplicity of such integrated circuits 8 (connected to contact connections 7), between which stepped structures and conductor tracks are formed in the subsequent method steps. The substrate 10 comprises, for example, $10^4$ to $10^6$ or even more integrated circuits 8 and can be, for example, a wafer or some other substrate. The substrate 10 can consist, in particular, of a non-etchable material such as, for instance, lithium tantalate or lithium niobate. The substrate shown in FIG. 1A can be surrounded on both sides with a passivation layer (not illustrated in greater detail here), composed of, for example, silicon nitride, silicon oxide, titanium nitride or some other dielectric material; the passivation layer can furthermore be omitted in the region of the contact connections 7 to be contact-connected.

Figure 1B:
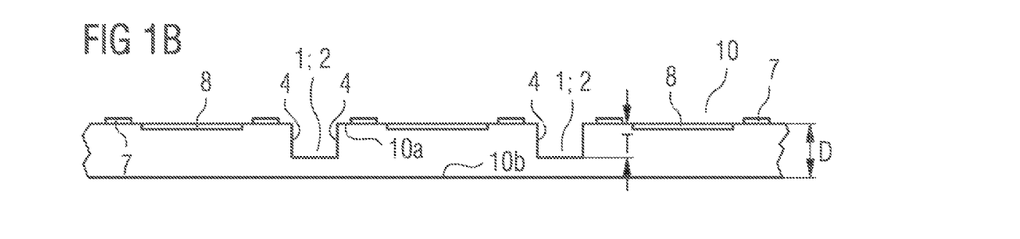

In accordance with FIG. 1B, stepped structures 1, namely trenches 2, are formed between the integrated circuits 8. This can be done by sawing the substrate, by sandblasting, by wet etching or dry etching or in some other manner. The depth T of the stepped structures 1 or trenches 2 is preferably between 5 and 75 percent of the substrate thickness D. The side flanks 4 of the stepped structures 1 or of the trenches 2 need not run exactly perpendicularly to the first main area 10a of the substrate 10, as illustrated, but rather can also deviate from the perpendicular direction by, for example, up to 10° or even 30°. Nevertheless, stepped structures having side flanks arise in this method step. The stepped structures surround the individual integrated circuits 8 in a frame-type manner, for instance in the manner of a rectangular grid, and thereby define the later contours of the respective chips.

Figure 1C:
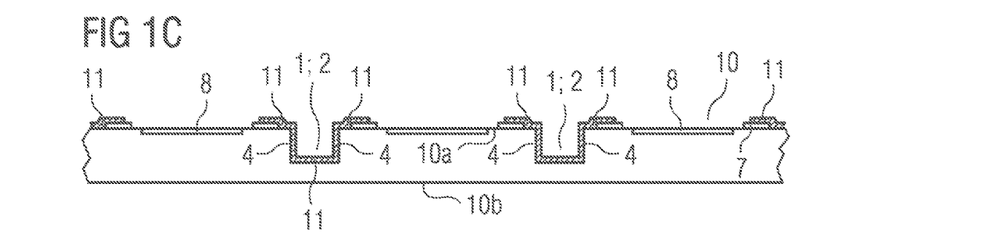

According to FIG. 1C, first conductor tracks 11 are formed from the first main area 10a, the conductor tracks extending in a manner proceeding from the contact connections 7 or at least from some of the latter as far as the stepped structures and covering in particular the side flanks 4 thereof. The conductor tracks 11, which are metallic, for example, are usually formed by a metal layer firstly being deposited over the whole area, wherein area regions in which the integrated circuits 8 are arranged can be covered by corresponding masks. The deposition can also be effected over the whole area on the first main area 10a including the trenches 2. The deposition is followed in each case by a structuring of the deposited metal layer. In this case, well-defined first conductor tracks 11 are structured, which produce a conductive connection between the side flanks 4 of the stepped structures 1 (namely the trenches 2), and the contact connections 7.

Figure 1D:
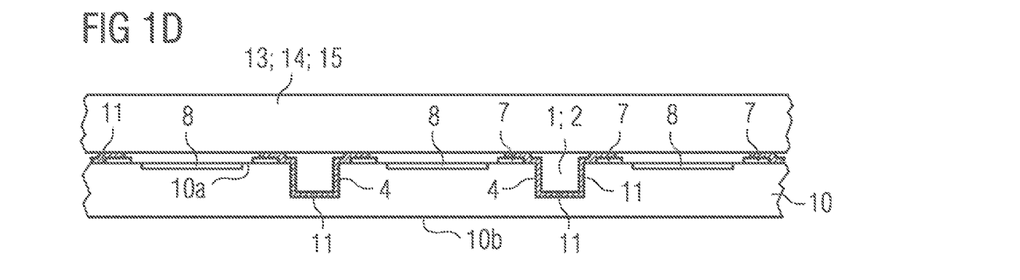

In accordance with FIG. 1D, firstly the further substrate 13 or alternatively a stack 14 of further substrates or some other carrier substrate 15 is bonded onto the first substrate 10 on the side of the first main area 10a. The bonding connection between both substrates can be formed in the region of the top side of each individual chip region optionally over the whole area or for instance selectively in frame-type edge regions around each integrated circuit. Afterward, the first conductor tracks 11 are temporarily accessible neither from above nor from below. Incidentally, FIGS. 1A to 1G illustrate the contact connections 7 and the first conductor tracks 11 with an exaggerated size in order to enable them to be identified better. However, they need not or not appreciably project above the first main area 10a of the first substrate 10. Consequently, in the described figures of this application, the further substrate 13 (or 14 or 15) can bear directly on the first main area 10a of the first substrate 10.

Figure 1E:
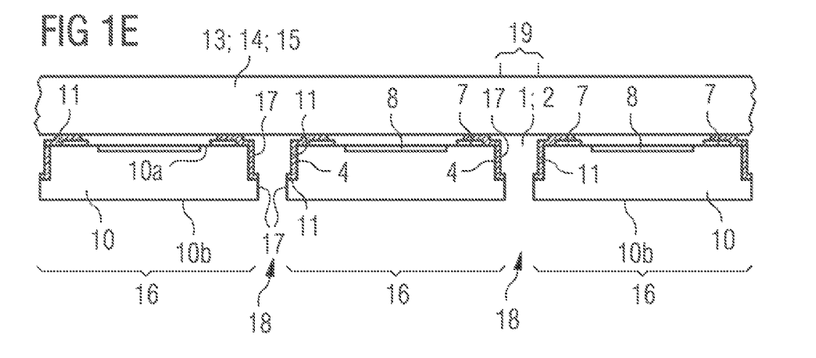
Figure 1F:
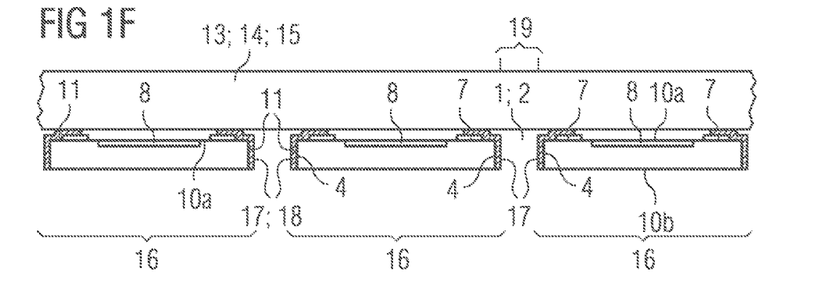

FIGS. 1E and 1F show two variants of the following method step by which the first substrate 10 is divided from its second main area 10b into a multiplicity of individual substrate pieces 16 and thus into a multiplicity of chips. In accordance with FIG. 1E, this is done (from the second main area 10b) for instance by sandblasting, laser ablation, wet etching or dry etching. As a result, along the sawing streets 19, the connections between the different integrated circuits 8 or chip regions below the bottoms of the trenches 2 are removed and the side flanks 4 of the trenches 2 thus become accessible from below. The side flanks 4 therefore now form a portion of the side walls 17 of the substrate pieces 16 which are held together by the upper substrate 13 (or 14 or 15).

In accordance with FIG. 1F, however, the step of severing or dividing the first substrate 10 can preferably also be effected by rear-side thinning of the substrate, in particular by polishing and thus grinding the second main area 10b. This removes a remaining part of the substrate thickness below the trenches 2 over the whole area. This has the advantage that alignment in a lateral direction is not necessary. Upon reaching the bottoms of the trenches and removing the regions of the first conductor tracks 11 that are present there, there remain mutually separated substrate pieces 16 each having an integrated circuit 8 which are held together by the upper substrate. Once again, at the side flanks 4 (which now form the side walls 17 of the substrate pieces 16) the first conductor tracks 11 (i.e., their conductor track sections running there) are accessible.

Figure 1G:
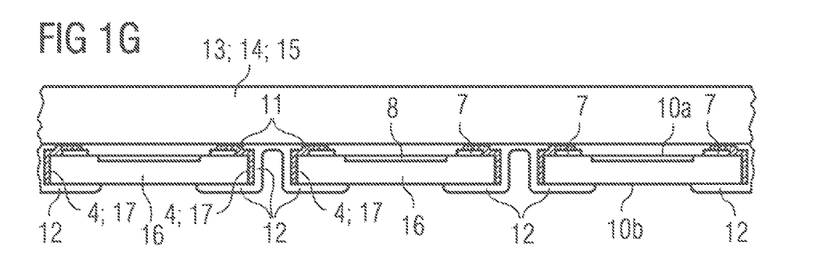

In accordance with FIG. 1G, second conductor tracks are formed from the side of the second main area 10b (after the severing of the first substrate in accordance with FIG. 1E or FIG. 1F). Preferably, firstly a conductive material (metal, metal alloy or a multilayer sequence) is deposited over the whole area and then structured to form second conductor tracks 12 (having a layer thickness of preferably less than 2 micrometers). Since in the interspaces 18 (FIGS. 1E and 1F), the first conductor tracks 11 are uncovered in the region of the side flanks 4 of the former trenches 2, the material for the second conductor tracks 12 is deposited there directly onto the first conductor tracks 11. After the structuring, whereby the contours of the second conductor tracks 12 are formed, the second conductor tracks 12 thus continue the first conductor tracks 11 as far as the second main area 10b. The conductor tracks resulting overall thus lead from the first main area 10a as far as the second main area 10b of the first substrate 10 (or its substrate pieces 16) and thus make it possible to stack substrate pieces in a plurality of levels or planes. If more than two substrates are to be stacked one above another, the steps in FIGS. 1A to 1G are repeated on a plurality of substrates. In this case, the overall arrangement illustrated in FIG. 1F, instead of the illustrated further substrate 13 or carrier substrate 15 (or as stack 14 of further substrates), analogously to FIG. 1D, is bonded onto the top side of a further, bottom-most substrate. By recursively carrying out the method steps in accordance with FIGS. 1A to 1G, therefore, it is possible for a large number of substrates to be successively stacked one above another and then electrically connected with one another by means of second conductor tracks. In addition to deposition (by PVD or CVD) and structuring, the first and/or second conductor tracks can also be produced by deposition by plating or by any chemical method or else with the aid of nanoparticles. The nanoparticles can contain, e.g., silver and polymer molecules; they can, for instance, be sprayed on as a suspension or be applied by a jet printing method.

Figure 1H:
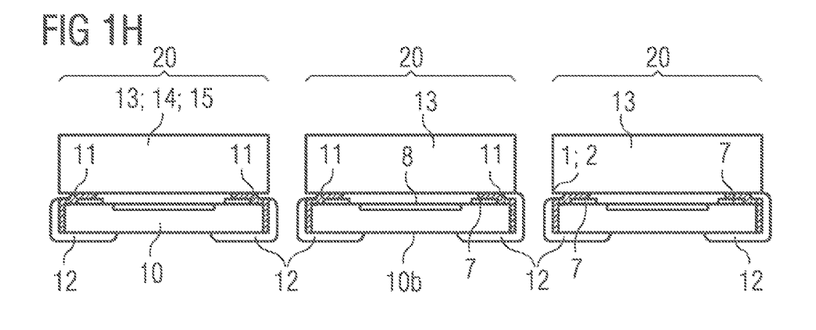

In accordance with FIG. 1H, finally, the topmost substrate (the further substrate 13, the carrier substrate 15 or the stack 14 of further substrates) is divided or severed, to be precise in the region of the sawing streets 19 indicated in FIGS. 1E and 1F. This results in a multiplicity of arrangements 20 which each contain a corresponding number of (here two) chips or substrate pieces stacked one above another which are mechanically and also electrically connected to one another. If more than two substrates are stacked one above another, after the concluding formation of the second conductor tracks 12 the topmost substrate is finally severed in accordance with FIG. 1H, preferably by sawing.

Figure 2A:
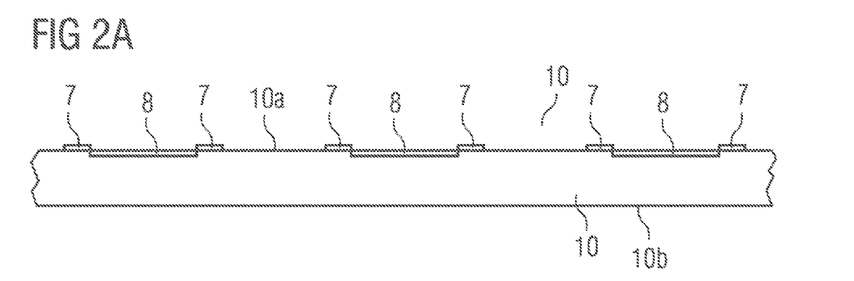
FIGS. 2A to 2G show a second type of embodiment.
Figure 2B:
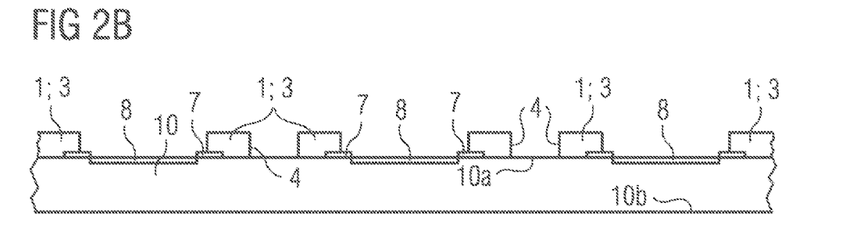
Figure 2C:
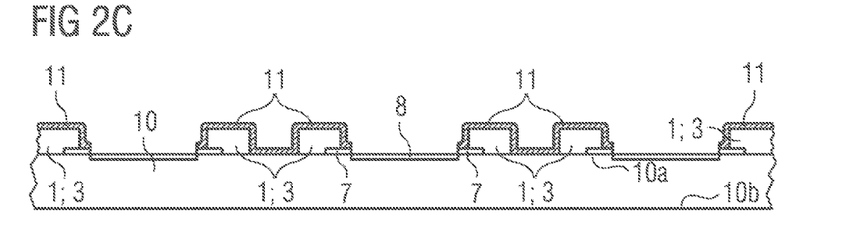
Figure 2D:
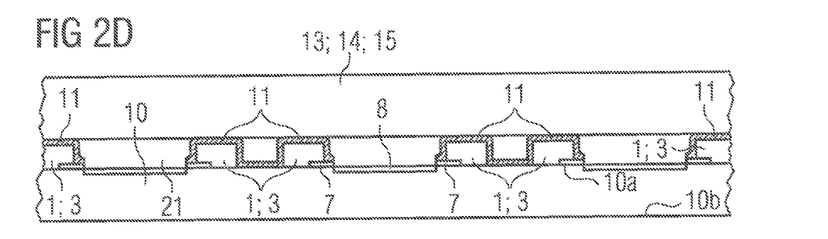
Figure 2E:
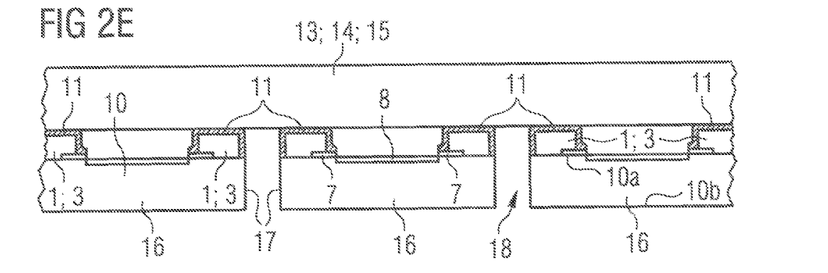
Figure 2F:
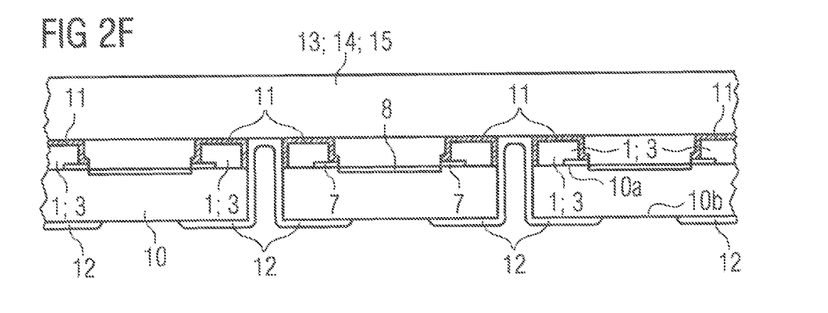
Figure 2G:
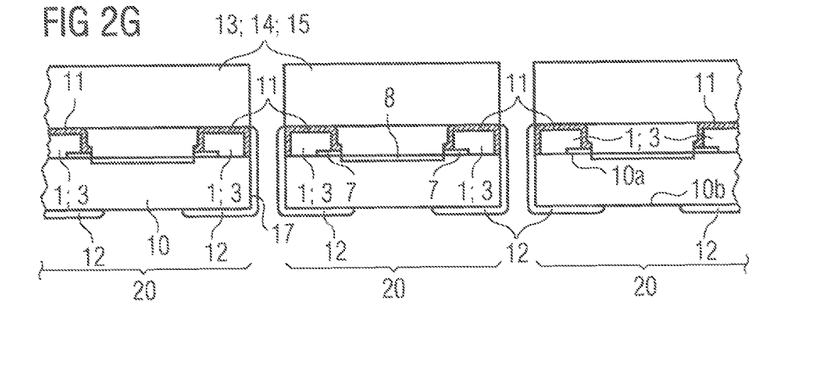

FIGS. 2A to 2G show a second type of embodiment of the method presented here. On the first substrate 10 from FIG. 2A, stepped structures 1 are once again produced, as can be seen in FIG. 2B, but this time in the form of ridges 3 which are arranged above the first main area 10a and project above the first main area 10a. The ridges 3 can be three-dimensionally shaped structure elements which are formed, in particular, from polymer compound or other dielectric materials, for instance by deposition and subsequent structuring. The ridges can be formed, in particular, from a curable material, for instance a permanent resist or from permanent polymers. In accordance with FIG. 2C, first conductor tracks 11 are formed, which extend from the contact connections 7 as far as the ridges 3 and cover the latter. A conductive connection between the two is produced as a result. The ridges 3 can, but need not necessarily, cover the contact connections 7 in regions. In accordance with FIG. 2D, a further substrate 13 (or a carrier substrate 15 or a stack 14 of further substrates) is bonded onto the top side of the first substrate 10, wherein, in particular, the ridges 3 which surround each integrated circuit 8 individually in a frame-type manner are utilized as bonding areas. A cavity 21 can be enclosed within each frame-type ridge 3 (cavity housing). Alternatively, this area region can likewise be utilized for substrate bonding. However, the substrate bonding is effected at least along frame-type edge regions around each semiconductor circuit. In accordance with FIG. 2E, the first substrate 10 is again divided into a multiplicity of substrate pieces 16, the side walls 17 of which are then exposed in the interspaces 18. As a result, those sections of the first conductor tracks 11 which run at the uncovered side flanks of the stepped structures 1 or ridges 3 become accessible again and can subsequently be continued by the second conductor tracks 12 as far as the second main area 10b. The severing of the first substrate 10 in accordance with FIG. 2E is effected here not by thinning the wafer, but rather by a local action, in particular sawing, sandblasting, laser ablation or etching. In accordance with FIG. 2F, finally, the second conductor tracks 12 are formed and then concomitantly severed in accordance with FIG. 2G when the upper substrate 13; 14; 15 is severed. This gives rise to the arrangements 20 illustrated in FIG. 2G and each containing at least two stacked substrate pieces or chips. The second conductor tracks 12 running over the second main area 10b and the side walls 17 (including the side flanks 4 of the ridges 3) are once again conductively connected to the first conductor tracks 11.

Figure 3A:
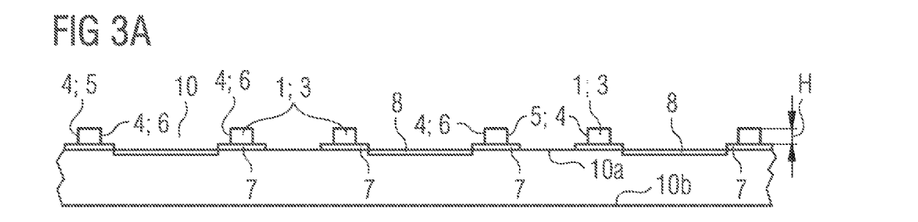
FIGS. 3A to 3G show a third type of embodiment.
Figure 3B:
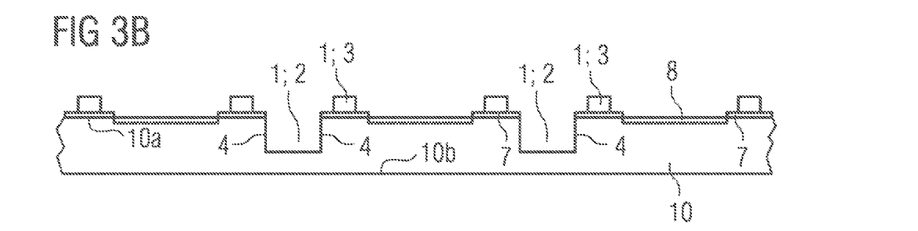
Figure 3C:
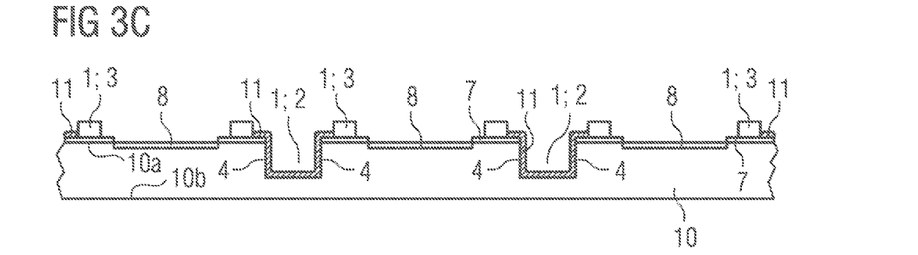

FIGS. 3A to 3G show a third type of embodiment of the method, wherein, in accordance with FIG. 3A, firstly first stepped structures 1, namely ridges 3, are formed and, in accordance with FIG. 3B, second stepped structures 1, namely trenches 2, are additionally formed. As in FIG. 1, the trenches 2 run in a cross-lattice-like manner between the respective integrated circuits 8 and surround the latter in a frame-type manner. In addition, each integrated circuit 8 is also individually surrounded by a ridge 3 that runs circumferentially in a frame-type manner and is rectangular for example in outline contour. The height of the ridge is H (as is the height of the contact connections 7) and is illustrated with an exaggerated size in the figures and is therefore not to scale. This applies to the lateral dimensions. The contact connections 7 can comprise connection regions running on both sides of the flanks 4 of the ridges 3 and thus extend in a lateral direction both in area regions within the inner side flanks 6 (FIG. 3A) and in regions laterally outside the outer side flanks 5 of the ridges 3. Consequently, a total of two ridges 3 run between two adjacent semiconductor circuits 8. The trenches 2 are then formed between them in accordance with FIG. 3B, before the first conductor tracks 11 are formed in accordance with FIG. 3C. Here they cover the bottom and the side flanks 4 of the trenches 2 and also the sections of the contact connections 7 outside the outer side flanks 5 of the ridges 3. However, they can additionally also cover the outer side flanks 5, the top sides and/or the inner side flanks 6 of the ridges 3.

Figure 3D:
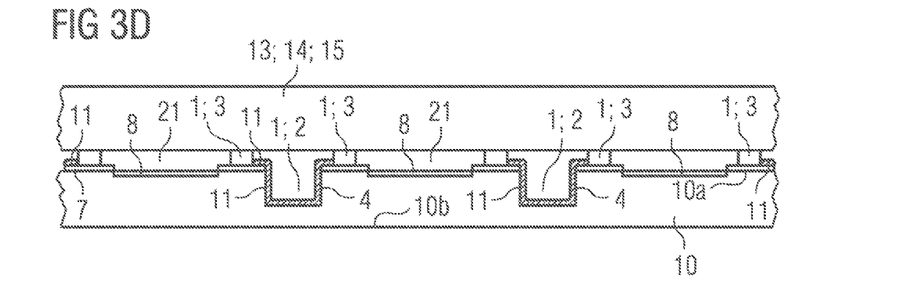
Figure 3E:
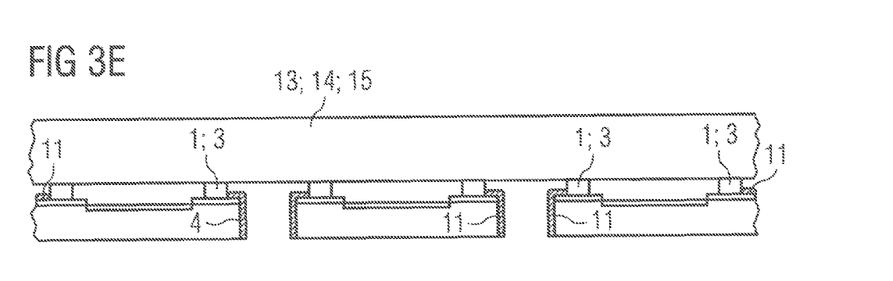
Figure 3F:
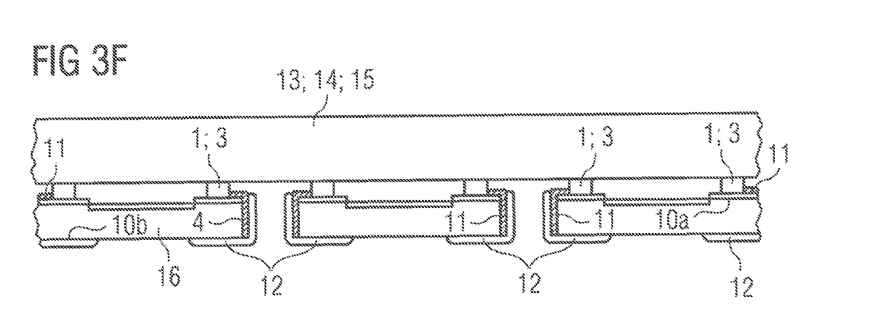
Figure 3G:
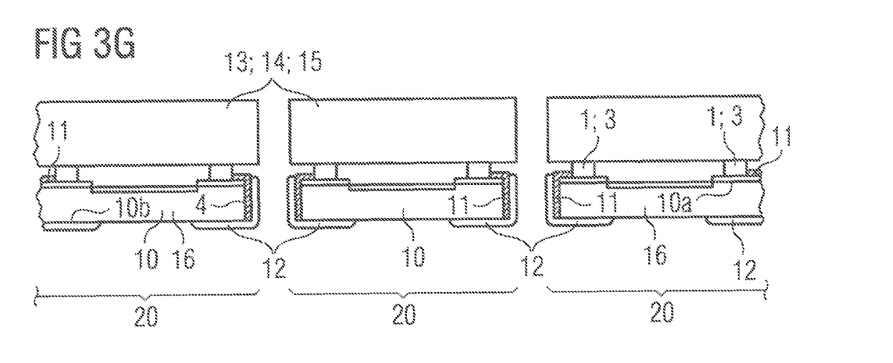

In accordance with FIG. 3D, a further substrate 13, a carrier substrate 15 or a stack 14 of further substrates is bonded onto at least the top sides of the ridges 3. In a manner similar to that in FIG. 2D, cavities 21 can arise above the integrated circuits 8 (cavity housing), provided that the chip regions are not bonded over the whole area to the upper substrate. In accordance with FIG. 3E, the first substrate 10 is again divided into substrate pieces 16, here by thinning the substrate 10 from the underside at least as far as above the bottoms of the original trenches 2. In accordance with FIG. 3F, the second conductor tracks 12 are formed on the side flanks 4, covered with the first conductor tracks 11, of the former trenches 2 and on the second main area 10b, before the upper substrate is divided, in accordance with FIG. 3G, by sawing, sandblasting, laser ablation or in some other way.

Figure 4A:
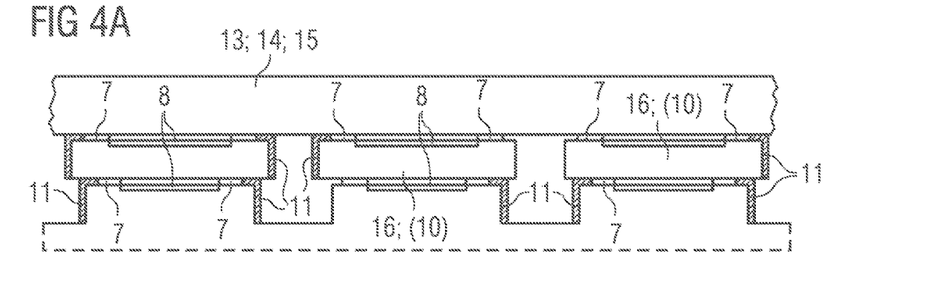
FIGS. 4A to 4C show a development with more than two substrate pieces stacked one above another.
Figure 4B:
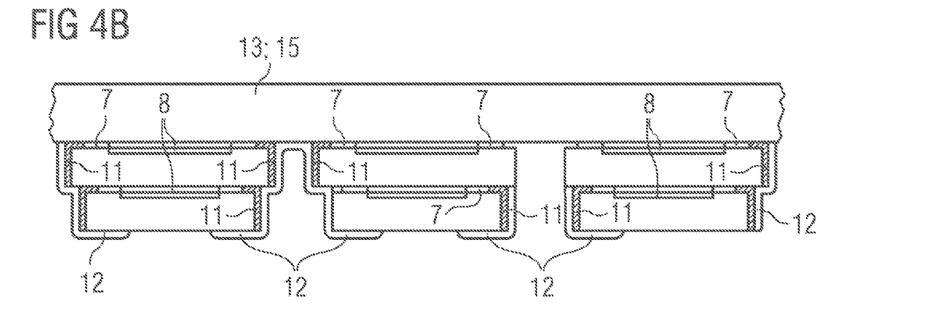
Figure 4C:
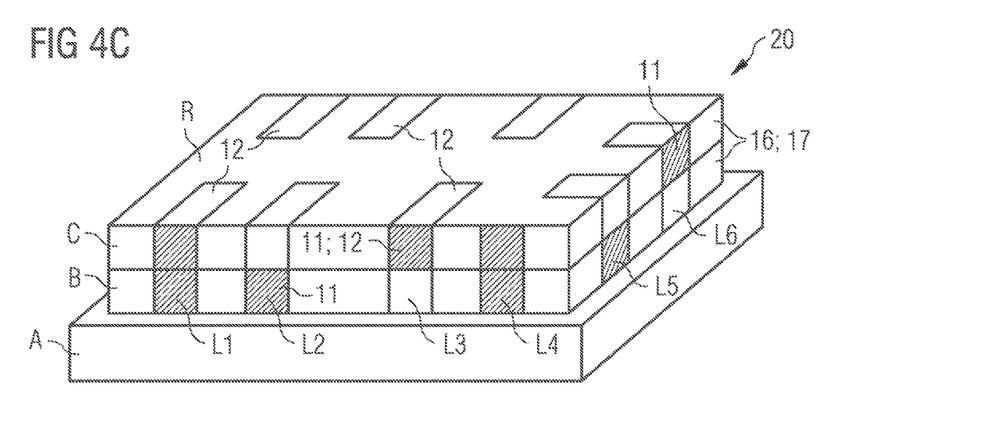

FIGS. 4A to 4C schematically show a development with more than two substrates stacked one above another. Firstly, a further substrate in accordance with FIG. 1C (or alternatively 2C or 3C) is bonded from below onto the underside of an arrangement in accordance with FIG. 1F (or alternatively 2E or 3E), thereby giving rise to the arrangement in accordance with FIG. 4A. The lower, continuous part of the further substrate is illustrated in a dashed fashion in FIG. 4A since it is subsequently removed (for instance by substrate thinning). However, this further substrate initially corresponds to a substrate as in FIG. 1C (or alternatively 2C or 3C). Consequently, a three-layered construction comprising a plurality of substrates stacked one above another arises below the topmost substrate 13 (or 14 or 15). The topmost substrate 13 (or 14 or 15) can (in the same way as in all the other figures), in a similar manner to the substrates arranged underneath, be provided with a multiplicity of semiconductor circuits and contact connections (not illustrated).

As can be discerned in FIG. 4A, not all the side walls of the substrate pieces need be provided with first conductor tracks 11 (shown black in the illustration). Instead, the first conductor tracks 11 can also be omitted on some side walls, such as, for instance, on the left side wall of the lower middle and of the upper right semiconductor chip. In accordance with FIG. 4B, after the bottom-most substrate has also been thinned, the second conductor tracks 12 are formed (for instance by metal deposition and subsequent structuring). During the structuring of the second conductor tracks 12, the metal can be removed in a targeted manner from some side walls, thus for instance at the level of the middle substrate plane between the middle and the right substrate piece that remained. The shaping of a second conductor track 12 is effected in a targeted manner only where a connection and continuation of a first conductor track 11 into a deeper plane is desired.

Finally, FIG. 4C shows a perspective view of a stack formed from three substrates. This arrangement 20 consists of the substrates A, B and C. In order to identify the conductive connections L1 to L6 formed by the first and second conductor tracks, the rear side, visible at the top in FIG. 4C, of the substrate C is additionally designated by R. In FIG. 4C, those regions, covered by the second conductor tracks 12, of the side walls 17 of the substrate pieces 16 on which a first conductor track 11 additionally also runs below the second conductor track 12 are illustrated in hatched fashion. In the case of the conductive connection L1, a first conductor track 11 is additionally situated on the side walls of both substrates B and C below the second conductor track 12, with the result that a continuous conductive electrical connection is produced between the rear side, lying at the top in FIG. 4C, of the substrate A and the contact connections at the bottom here of the substrates B and C and also the contact connections on the rear side R, discernible at the top, of the substrate C. By contrast, the conductive connection L4 connects only along the side walls 17 of the substrates B and C, but no longer makes contact with the rear side R of the substrate C.

The conductive connections L2 and L5 additionally also have a first conductor track 11 below the second conductor tracks 12 only on the side wall of the middle substrate B. Consequently, the conductive connection is produced only between the substrates A and B and (whilst bypassing the substrate C) toward the rear side R of the substrate C.

Conversely, in the case of the conductive connections L3 and L6, the first conductor tracks 11 are provided only on the side walls of the substrate C. Accordingly, only the contact connections of the substrate C are connected to the contact areas on the rear side R (at the top in FIG. 4C) of the substrate C and, if appropriate, the substrates A and B are also interconnected with one another. By modifying these exemplary configurations of the conductive connections produced with the aid of first and second conductor tracks, diverse and flexible contact-connection can be realized within a stack of a plurality of substrate pieces or chips.

What is claimed is:

1. A method for connecting a plurality of unpackaged substrates to one another, the method comprising:
   forming stepped structures on and/or in a first main area of a first substrate having a plurality of integrated circuits, wherein the stepped structures run between the integrated circuits;
   forming first conductor tracks extending from at least some contact connections of the respective integrated circuits as far as the stepped structures and covering side flanks of the stepped structures;
   connecting the first substrate on a side of the first main area to a further substrate;
   severing the first substrate from a second main area opposite to the first main area such that the first substrate is divided into a plurality of substrate pieces, each substrate piece having one of the integrated circuits, wherein the first conductor tracks become accessible in interspaces between the substrate pieces; and
   forming second conductor tracks from the second main area such that a material of the second conductor tracks is deposited directly onto the first conductor tracks that covered of the side flanks, wherein at least some of the second conductor tracks lead from the second main area over side walls of the substrate pieces as far as the first conductor tracks.

2. The method according to claim 1, wherein connecting the first substrate to the further substrate comprises connecting the first substrate to a stack of substrates.

3. The method according to claim 2, forming the stepped structures comprises forming ridges projecting above the first main area of the first substrate, the ridges surrounding individual integrated circuits in a frame-like manner and having a height that is between 2 percent and 50 percent of a thickness of the first substrate, wherein at least some of the first conductor tracks are structured such that they cross a top side of the ridges that surround the respective integrated circuit and/or cover both side flanks of the ridges.

4. The method according to claim 2, further comprising severing a carrier holding the stack of substrates into a plurality of arrangements, each arrangement connected to a substrate piece of the first substrate.

5. The method according to claim 1, wherein the first substrate is connected to the further substrate by substrate bonding.

6. The method according to claim 1, wherein forming the stepped structures comprises forming trenches in the first substrate, the trenches surrounding the individual integrated circuits in a frame-like manner and having a depth that is between 5 percent and 75 percent of a thickness of the first substrate, wherein at least some of the first conductor tracks are structured such that they cover at least one side flank of the trenches that surround the respective integrated circuit.

7. The method according to claim 1, forming the stepped structures comprises forming ridges projecting above the first main area of the first substrate, the ridges surrounding individual integrated circuits in a frame-like manner and having a height that is between 2 percent and 50 percent of a thickness of the first substrate, wherein at least some of the first conductor tracks are structured such that they cross a top side of the ridges that surround the respective integrated circuit and/or cover both side flanks of the ridges.

8. The method according to claim 1, wherein, in the interspaces between the substrate pieces, line ends of the first conductor tracks that cover the side flanks of the stepped structures are uncovered from the side of the second main area of the first substrate when severing the first substrate.

9. The method according to claim 8, wherein forming the second conductor tracks comprise contact connecting the line ends of the first conductor tracks.

10. The method according to claim 1, wherein connecting the first substrate to the further substrate comprises bonding the further substrate onto a top side of ridges projecting above the first main area of the first substrate.

11. The method according to claim 1, wherein connecting the first substrate to the further substrate comprises bonding the further substrate onto regions of the first main area which concomitantly contain at least one surrounding region extending around the respective integrated circuit.

12. The method according to claim 1, wherein severing the first substrate comprises dividing the first substrate from the second main area by whole-area grinding.

13. The method according to claim 1, wherein severing the first substrate comprises dividing the first substrate from the second main area by sawing.

14. The method according to claim 1, wherein severing the first substrate comprises dividing the first substrate from the second main area by sandblasting.

15. The method according to claim 1, wherein severing the first substrate comprises dividing the first substrate from the second main area by laser ablation.

16. The method according to claim 1, wherein the side flanks of the stepped structures are inclined by a maximum of ±30°, relative to the normal to a surface of the first main area of the first substrate.

17. The method according to claim 1, wherein the side flanks of the stepped structures are inclined by a maximum of ±10°, relative to the normal to a surface of the first main area of the first substrate.

18. The method according to claim 1, wherein forming the second conductor tracks comprises contact connecting line sections of the first conductor tracks that cover an area region of a side flank of the respective stepped structure that faces away from the surrounding integrated circuit with the second conductor tracks, wherein the line sections are continued by the second conductor tracks as far as the second main area of the respective substrate piece of the first substrate.

19. The method according to claim 1, further comprising severing the further substrate into a plurality of arrangements, each arrangement connected to a substrate piece of the first substrate.

20. The method according to claim 19, wherein severing the further substrate comprises sawing.

* * * * *